United States Patent [19]
Tait et al.

[11] Patent Number: 6,115,584
[45] Date of Patent: Sep. 5, 2000

[54] TRANSMITTER-RECEIVER FOR USE IN BROADBAND WIRELESS ACCESS COMMUNICATIONS SYSTEMS

[75] Inventors: Donald L. Tait, Torrance; Eric L. Upton, Redondo Beach; Franklin J. Bayuk, Rancho Palos Verdes, all of Calif.

[73] Assignee: TRW Inc., Redondo Beach, Calif.

[21] Appl. No.: 09/285,308

[22] Filed: Apr. 2, 1999

[51] Int. Cl.$^7$ ....................................................... H04Q 7/32
[52] U.S. Cl. .................. 455/73; 455/86; 455/78; 455/84; 455/85; 455/75; 455/83; 455/550; 455/575; 455/403; 455/503; 455/120; 455/121
[58] Field of Search ................................. 455/73, 56, 78, 455/83, 403, 503, 120, 121, 87, 85, 552, 84, 86, 75, 575, 550

[56] References Cited

U.S. PATENT DOCUMENTS

| | | | |
|---|---|---|---|
| 3,681,697 | 8/1972 | Moroney | 455/86 |
| 5,689,819 | 11/1997 | Nishimura et al. | 455/86 |
| 5,838,730 | 11/1998 | Cripps | 455/86 |
| 5,966,666 | 11/1999 | Yamaguchi et al. | 455/78 |
| 6,002,920 | 12/1999 | Consolazio et al. | 455/78 |

*Primary Examiner*—Fan Tsang
*Assistant Examiner*—Keith Ferguson
*Attorney, Agent, or Firm*—Michael S. Yatsko

[57] ABSTRACT

A transmitter-receiver includes a transmitting circuit for providing an output by converting the frequency of a transmission signal input thereto, a receiving circuit for providing an output by converting the frequency of a received signal input thereto, and a local oscillator which generates an oscillation signal having a local oscillating frequency based on a reference signal. A local oscillator signal splitter is connected to the local oscillator and splits the oscillation signal into substantially similar transmit and receive oscillation signals each at the local oscillating frequency. The local oscillator signal splitter supplies the transmit oscillation signal to the transmitting circuit and supplies the receive oscillation signal to the receiving circuit. The transmitting circuit converts the frequency of the transmission signal in accordance with said transmit oscillation signal, and the receiving circuit converts the frequency of the received signal in accordance with the receive oscillation signal.

5 Claims, 1 Drawing Sheet

TRANSMITTER-RECEIVER FOR USE IN BROADBAND WIRELESS ACCESS COMMUNICATIONS SYSTEMS

BACKGROUND OF THE INVENTION

1. Field of the Invention

This invention relates generally to transmitter-receivers and, more particularly, relates to a transmitter-receiver to be used in broadband wireless access communications systems.

2. Description of the Related Art

A transmitter-receiver generally has a transmitting circuit for effecting transmission processing of sound information, data, and the like through an antenna, and a receiving circuit for effecting reception processing of sound information, data, and the like through an antenna. Since the transmitting circuit and the receiving circuit are to process information independently from each other, it is desirable that they do not interfere with each other. However, if a transmitting circuit and a receiving circuit are located physically close to each other, a mutual interference may occur due to an intrusion of a transmitting wave into the receiving circuit or of a receiving wave into the transmitting circuit. Since, in the case of a phone used in satellite communication systems, there may be a difference of 150 dB or more between the transmitting power and the receiving power, a deterioration in the receiving wave input from the antenna occurs if a transmitting wave at a high level intrudes into the receiving circuit, though a similar problem is not likely to occur if a receiving wave at a relatively low level sneaks in the transmitting circuit. For this reason, in a conventional terminal for a satellite communication system or the like, the transmitting circuit and receiving circuit may be formed on different assemblies and are provided with a sufficient shield.

However, as it is desirable to reduce the size and weight of communication equipment generally, it is inevitable that the transmitting circuit and the receiving circuit are located close to each other, on the same assembly.

In addition, narrowing of bands for the radio channel spacing is necessary from the viewpoint of effective utilization of frequencies, and a development of a low price transmitter-receiver achieving these by a simple construction is in demand. But to achieve the narrowing of bands for the radio channel spacing, a filter having a steep damping characteristic for suppressing an interference between neighboring channels becomes necessary. Therefore, circuit construction of the transmitter-receiver becomes complicated, resulting in problems such as an increase in price of the transmitter-receiver.

One attempt to overcome these disadvantages of the prior art has been the development of a transmitter-receiver as described in U.S. Pat. No. 5,689,819. There is described a transmitter-receiver which is located on a single assembly, with transmit and receive circuits being closely located to each other. However, the design illustrated therein suffers from certain disadvantages in that three separate local oscillator frequencies are utilized. These frequencies are selected to provide the necessary isolation between transmitter and receiver, but require associated hardware for each frequency which increases complexity and consumes valuable power source capacity in the hand-held communications products described.

From the above, it can be appreciated that it would be desirable to provide a transmitter-receiver circuit for communications applications which allows for close spacing between the circuit components while lowering costs and weight and which minimizes the amount of hardware and power consumption.

SUMMARY OF THE INVENTION

The above described need is met by the transmitter-receiver of the present invention which, in a first aspect, includes a transmitting circuit for providing an output by converting the frequency of a transmission signal input thereto. A receiving circuit provides an output by converting the frequency of a received signal input thereto. A local oscillator generates an oscillation signal having a local oscillating frequency based on a reference signal. A local oscillator signal splitter is connected to the local oscillator and splits the oscillation signal into substantially similar transmit and receive oscillation signals each at the local oscillating frequency. The local oscillator signal splitter supplies the transmit oscillation signal to the transmitting circuit and supplies the receive oscillation signal to the receiving circuit. The transmitting circuit converts the frequency of the transmission signal in accordance with said transmit oscillation signal, and the receiving circuit converts the frequency of the received signal in accordance with the receive oscillation signal. The use of a single shared local oscillator (LO) enables simultaneous transmit and receive functions to be performed using a minimum of components. By careful selection of the transmit and receive frequencies, in conjunction with the common local oscillator the transmit and receive intermediate frequencies can be inherently isolated from one another and thus mitigate against interference allowing for an efficient transceiver construction.

BRIEF DESCRIPTION OF THE DRAWING

Reference is now made to the Description of the Preferred Embodiment, illustrated in the sole accompanying drawing, in which the sole FIGURE is an electrical schematic illustration of the circuitry of the transmitter-receiver of the present invention.

DESCRIPTION OF THE PREFERRED EMBODIMENT

Figure 1:
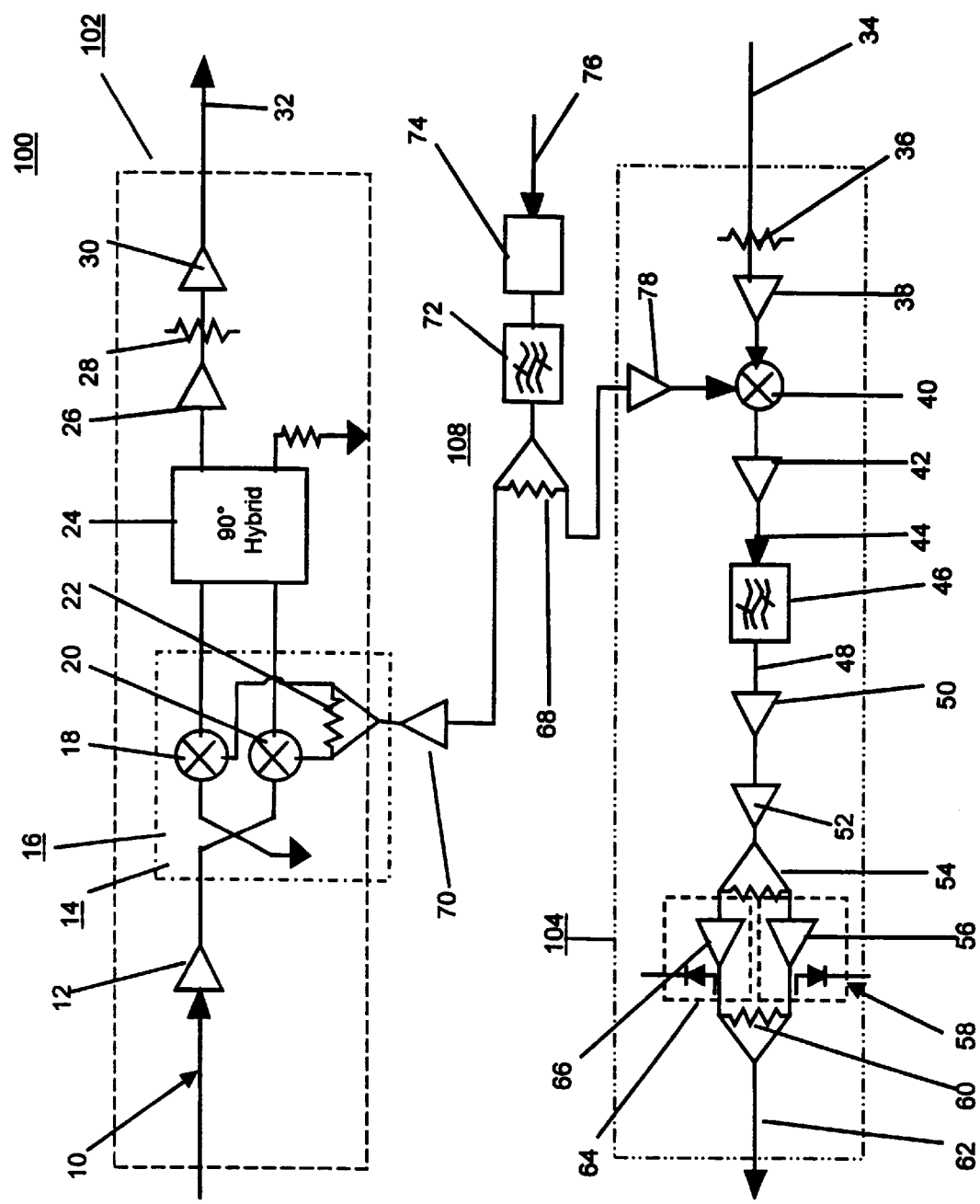

As illustrated in the FIGURE, the transmitter-receiver (or transceiver) 100 of this invention is a radio frequency (RF) transceiver especially useful for Ka Band frequencies which is comprised of a receiver portion 102, a transmitter portion 104 and a local oscillator portion 108 all located closely spaced adjacent to each other. The receiver 102 has a RF input 10 which, in the preferred embodiment, can be a waveguide, coax, microstrip or any form of transmission line coupler used to provide a low loss, industry standard mechanical interface for the receipt of RF signals such as those, for example, in the frequency range of 38.6 to 40 GHZ. The input 10 feeds the RF signal to a low noise amplifier 12, which can be a GaAs High Electron Mobility Transistor (HEMT) low noise amplifier, which provides superior noise minimization while simultaneously providing a high gain. Use of this amplifier improves the system dynamic range of the receiver, and provides a much greater receiver range than would be possible with other types of amplifiers.

The output of the amplifier 12 is connected to an image reject mixer 14, which provides for splitting the received signal into two paths and which is utilized to minimize and/or eliminate local oscillator image frequency spurious products from received intermediate frequency signals. The image reject mixer 14 incorporates a 90° hybrid 16 to enable the mixer to function properly. The hybrid 16 can be a Lange-type coupler which enables the image reject mixer 14 to perform over a wide RF input frequency bandwidth. The Lange-type coupler implementation of the hybrid 16 is also compatible with the GaAs Monolithic Microwave Integrated Circuit (MMIC) implementation of the image reject mixer 14.

As illustrated, the image reject mixer 14 is formed from a first mixer 18 and a second mixer 20, both of which are Schottky diode mixers used to provide excellent frequency conversion performance with very low conversion loss. The first mixer 18 receives inputs from the amplifier 12 and the local oscillator power splitter 22 in a fashion to be hereinafter explained, and provides an intermediate frequency output to one branch of the 90° hybrid 24. The second mixer 20 also receives the output from the amplifier 12, combines it with the output from the local oscillator power splitter 22 to translate the received input signal into an intermediate frequency signal, and outputs this intermediate frequency signal to the other branch of the 90° hybrid 24.

As described, the RF signal is combined with the local oscillator power splitter signal (LO). The result of this process is multiples of the sum and difference of the RF and LO. As an example an RF frequency of M mixed with a LO frequency of N will result in Intermediate Frequency signals (IF) of M×RF+N×LO and M×RF−N×LO products where M and N are integer numbers (1,2,3,4 . . . ). So for example, if RF=24.5 GHz and LO=24.75 GHz, the IFs that will result are as shown in the table below:

| M | N | Sum IF (GHz) | Difference IF (GHz) |
|---|---|---|---|
| 1 | 1 | 49.25 | 0.25 |
| 1 | 2 | 74 | 25 |
| 1 | 3 | 98.75 | 49.75 |
| 2 | 1 | 73.75 | 24.25 |
| 2 | 2 | 98.5 | 0.5 |
| 2 | 3 | 123.25 | 25.25 |

If the desired IF is 0.25 GHz, selectivity is obtained by the IF amplifier 26 passband characteristics and subsequent filtering within or outside the transceiver. All the other products then become non interfering. The image reject mixer 14 implementation allows for phasing to reject the image frequency due to inherent phase cancellation or out of phase signal adding together thus negating each other. In this example the presence of an interfering signal at 25 GHz (the image) would be rejected by virtue of the of the mixer implementation.

In the 90° hybrid 24, the two signals are combined and, because of the constructive and destructive phase relationships of the output signals from the image reject, mixer, are devoid of unwanted image frequency components. This cleansed signal is then provided to the intermediate frequency amplifier 26. The amplifier 26 amplifies the signal, and conducts it to the receiver temperature compensating attenuator 28.

The receiver temperature compensating attenuator 28 functions to reduce intermediate frequency output power variation due to amplifier 26 gain variation at varying operating temperatures. Attenuator 28 gain change with respect to temperature is opposite that of the amplifier 26 gain variation due to temperature variation and, as a result, the two effects cancel and thus minimize gain variation.

After exiting from the receiver temperature compensating attenuator 28, the signal is passed through, and amplified within, the received intermediate frequency output amplifier 30, from which it then exits 32 the transceiver 100 to be supplied to the remainder of the demodulation or processing circuitry (not shown).

The transmitter 104 portion of the transceiver 100 includes a transmit intermediate frequency input port 34 which is in signal communication with the remainder of the modulation or processing circuitry (not shown) and is the port where the signal to be transmitted enters the transceiver 100. The input signal would typically be a signal having a broad frequency consistent with the modulation format and might be, for example, within the range of 450 to 650 MHz. The signal frequency would be chosen so as to preclude overlapping with signal frequencies in the receive portion 102 of the transceiver 100. The input port 34 supplies the signal to be output to the transmitter temperature compensating attenuator 36, which functions to reduce intermediate frequency output power variation due to amplifier 38 gain variation at varying operating temperatures. Attenuator 36 gain change with respect to temperature is opposite that of the amplifier 38 gain variation due to temperature variation and, as a result, the two effects cancel and therefore minimize gain variation.

The signal output from the attenuator is supplied to the amplifier 38, amplified, and transmitted to the up-converting mixer 40. The up-converting mixer 40 is a single, double-balanced Schottky diode mixer, which also has as an input from the output of the transmit local oscillator driver 78.

In the mixer 40, the intermediate frequency signal and the local oscillator driver 78 signal are combined to produce a RF signal output without signal images being included. For example, if the intermediate frequency signal is chosen to be 0.55 GHz for the same shared LO of 24.75 GHz and an RF output of 25.3 GHz. then the following table applies:

| M | N | Sum IF (GHz) | Difference IF (GHz) |
|---|---|---|---|
| 1 | 1 | 25.3 | 24.2 |
| 1 | 2 | 50.05 | 48.95 |
| 1 | 3 | 74.8 | 73.7 |
| 2 | 1 | 25.85 | 23.65 |
| 2 | 2 | 50.6 | 48.4 |
| 2 | 3 | 75.35 | 73.15 |

The RF output signal derived from the up-converting mixer 40 is supplied to the transmitter driver amplifier 42, where it is amplified and supplied to a bandpass filter 46 through the filter interface 44. As with the low noise amplifier 12, the transmitter driver amplifier 42 can be a GaAs HEMT low noise amplifier, which provides superior noise minimization while simultaneously providing a high gain. The filter interface 44 connects to the HEMT amplifiers 42 by an appropriate transition to accommodate various transmission line media such as a waveguide, microstrip or stripline. The transition is very well matched and provides efficient transfer of RF signals with minimal signal loss.

The bandpass filter 46 is used to allow high out of band rejection, low pass band insertion loss, and very steep filter cutoff. The filter 46 functions to remove extraneous noise and to provide only that signal which is desired to be sent to be further transmitted. By appropriate filtering, preference is given to the desired frequency and the potential interference frequencies are blocked from entering the receive channel and appearing as an interference signal.

The signal output from the bandpass filter 46 is sent through the filter interface 48 to the RF driver amplifier 50.

The RF driver amplifier 50 is a GaAs HEMT low noise amplifier which features a superior output linearity while simultaneously providing high gain. The high linearity of this amplifier 50 improves dynamic range and provides a much greater transmitter range.

The signal output from the RF driver amplifier 50 is supplied through the RF power amplifier preamp 52 to the power amplifier splitter 54. The power amplifier splitter 54 is an in-phase low loss power splitter implemented to allow two power amplifier chips 56, 66 to be driven in parallel. This implementation simplifies the construction of the two individual power amplifier chips 56, 66.

The chips 56, 66 are each GaAs HEMT power amplifiers incorporating HEMT transistors for providing increased RF output power and efficiency (amount of dc power required for a given RF output power). By devising the transmitter output amplifiers 56, 66 as two separate chips, thermal design of the transmitter 104 is optimized, MMIC chip size and cost are reduced, power amplifier chip yields are improved, and chip design time and associated costs are reduced.

The power amplifier chips 56, 66 are respectively parts of first and second RF output power detectors 58, 64. Each of these detectors 58, 64 are provided to allow monitoring of amplifier health, determining amplifier RF output power, and to provide opportunity for automatic level control of transmitter output power levels.

The signals from the output power amplifiers 56, 66 are combined in the output power amplifier combiner 60, and then transmitted out of the transceiver 100 through the RF output port 62. The transmitted signals would in a typical case be RF signals having a frequency prescribed to a desired RF spectrum channel such as that within the range of 38.6 to 40 GHz.

Part of both the transmitter 104 and receiver 102 is a shared local oscillator function 108. The local oscillator function 108 includes the local oscillator input port 76, which supplies LO input signals to the multiplier 74. The LO input signals would typically be within the GHZ frequency range as determined by the low noise system requirements and the source employed crystal oscillators, voltage-controlled oscillators, synthesizers and the like, and could be, for example, with the range of 12.9 to 13.3 GHZ, and would be multiplied in the multiplier 74 to a frequency necessary for translation to the desired transmit or receive down conversion frequency. The multiplier 74 would preferably be a GaAs Self Aligned Base and Emitter Metal (SABEM) heterojunction bipolar transistor (HBT) based multiplier. HBT implementation of this multiplier 74 provides high efficiency and allows integration of the multiplier 74 on a single MMIC.

The signal output from the multiplier 74 is supplied to the LO bandpass filter 72, where undesired harmonics of RF signal generated within the LO multiplier 74 are removed. The cleansed signal is then supplied to the LO splitter 68, which splits the LO signal into two paths for use in both the transmitter 104 and the receiver 102 portions of the transceiver 100. Use of the splitter 68 eliminates the requirement for two separate local oscillators and reduces the cost, complexity and weight of the resulting transceiver 100. The signals from the LO splitter 68 are supplied to the transmitter local oscillator amplifier driver 78 and the receiver local oscillator amplifier 70.

The transceiver as described above provides for an external frequency reference, illustrated as the single LO input, but with no additional hardware required for translation. The transceiver has extremely broad broadband circuitry and can support both transmit and receive intermediate frequencies offset from each other at a stage prior to the final high frequency transceiver stage. It is capable of being tuned from a synthesizer or other source of local oscillator signals. This makes the design more flexible and tunable over a range of frequencies while maintaining greater stability at the tuned frequency. The transceiver also eliminates the problem of differential temperature drift within internally generated local oscillators.

We claim as our invention:

1. A transmitter-receiver comprising:
   a transmitting circuit for providing an output by converting frequency of a transmission signal input thereto;
   a local oscillator for generating an oscillation signal having local oscillating frequency based on a reference signal;
   a local oscillator signal splitter connected to said local oscillator and splitting the oscillation signal into substantially similar transmit and receive oscillation signals each at the local oscillating frequency, the local oscillator signal splitter supplying the transmit oscillation signal to said transmitting circuit;
   a receiving circuit for providing an output by converting a frequency of a received signal input thereto, the local oscillator signal splitter supplying the receive oscillation signal to said receiving circuit, said receiving circuit comprising:
   a receiving input port for supplying the received signal to said receiving circuit;
   an image reject mixer in electrical communication with said input port, said image reject mixer combining said received signal and said receive oscillation signal to produce first and second intermediate frequency receive signals;
   a hybrid in electrical communication with said image reject mixer and receiving said first and second intermediate frequency receive signals, said hybrid combining said first and second intermediate frequency receive signals to produce an output received signal devoid of undesired image frequency components; and
   a reception output port connected to said hybrid for delivering said output received signal externally of said transmitting circuit;
   said transmitting circuit converting the frequency of the transmission signal in accordance with said transmit oscillation signal, and said receiving circuit converting the frequency of the received signal in accordance with said receive oscillation signal.

2. The transmitter-receiver according to claim 1 wherein said image reject mixer comprises:
   a first mixer having an output electrically connected to said hybrid and receiving said receive oscillation signal and said received signal, said first mixer converting said received signal to a first intermediate frequency as a function of said receive oscillation signal; and
   a second mixer having an output electrically connected to said hybrid and receiving said receive oscillation signal and said received signal, said second mixer converting said received signal to a second intermediate frequency as a function of said receive oscillation signal.

3. The transmitter-receiver according to claim 2 wherein said first mixer and said second mixers each comprise Lange-type couplers.

4. The transmitter-receiver according to claim 2 wherein said hybrid comprises a 90° hybrid coupler having first and second inputs and an output, said first coupler input connected to said first mixer and receiving said first intermediate frequency receive signal therefrom, said second coupler input connected to said second mixer and receiving said second intermediate frequency receive signal therefrom, said hybrid coupler combining said first and second intermediate frequency receive signals to produce said output received signal.

5. A transmitter-receiver comprising:

a local oscillator for generating an oscillation signal having a local oscillating frequency based on a reference signal;

a local oscillator signal splitter connected to said local oscillator and splitting the oscillation signal into substantially similar transmit and receive oscillation signals each at the local oscillating frequency;

a receiving circuit for providing an output by converting a frequency of a received signal input thereto, the local oscillator signal splitter supplying the receive oscillation signal to said receiving circuit, a transmitting circuit for providing an output by converting frequency of a transmission signal input thereto, the local oscillator signal splitter supplying the transmit oscillation signal to said transmitting circuit, said transmitting circuit comprising:

a transmitting input port for supplying the transmission signal to said transmitting circuit;

an up-converting mixer in electrical communication with said transmitting input port and with said local oscillator signal splitter, said up-converting mixer converting the frequency of said transmission signal as a function of said transmit oscillation signal; and a transmission output port electrically connected with said up-converting mixer for transmitting said transmission signal externally to said receiving circuit, said transmission output port being electrically connected with said up-converting mixer through a pair of parallel connected power amplifiers, each power amplifier being a GaAs power amplifier including high electron mobility transistors;

said transmitting circuit converting the frequency of the transmission signal in accordance with said transmit oscillation signal, and said receiving circuit converting the frequency of the received signal in accordance with said receive oscillation signal.

* * * * *